United States Patent
Wik

(10) Patent No.: US 8,921,680 B1
(45) Date of Patent: Dec. 30, 2014

(54) LOW-COST SOLAR COLLECTOR

(76) Inventor: Thomas Robert Wik, Livermore, CA (US)

( * ) Notice: Subject to any disclaimer, the term of this patent is extended or adjusted under 35 U.S.C. 154(b) by 324 days.

(21) Appl. No.: 11/982,785

(22) Filed: Nov. 5, 2007

Related U.S. Application Data

(60) Provisional application No. 60/857,014, filed on Nov. 6, 2006.

(51) Int. Cl.
  *H01L 31/0232* (2014.01)
(52) U.S. Cl.
  USPC ............................................ 136/246; 136/259
(58) Field of Classification Search
  USPC ...................... 136/246, 259, 251, 245; 438/55
  See application file for complete search history.

(56) References Cited

U.S. PATENT DOCUMENTS

| | | | | |
|---|---|---|---|---|
| 4,131,485 A | * | 12/1978 | Meinel et al. ................. | 136/259 |
| 4,177,083 A | * | 12/1979 | Kennedy ....................... | 136/259 |
| 4,306,540 A | * | 12/1981 | Hutchison ..................... | 126/607 |
| 5,660,644 A | * | 8/1997 | Clemens ........................ | 136/245 |
| 6,818,818 B2 | * | 11/2004 | Bareis ........................... | 136/246 |

* cited by examiner

*Primary Examiner* — Jayne Mershon

(57) ABSTRACT

A low-cost solar collector employs a concave reflecting surface and a convex reflecting surface configured as a cylindrical Cassegrain optical system with planar symmetry to concentrate sunlight for photovoltaic solar panels. The collector achieves high concentration factors exceeding 20× and maintains focus of concentrated sunlight on the photovoltaic cells using a simple mechanical means to rotate the collector. A plurality of solar collectors is arranged in parallel in a conventional solar panel form factor and driven by a single drive system to maintain the sun continuously in the plane of symmetry of each of the solar collectors that comprise the solar panel. This reduces the area of photovoltaic cells required to convert a given quantity of light energy to electrical energy. Cost of electrical energy generated is reduced significantly because the cost per unit area of the solar collectors is much less than the cost of photovoltaic cells.

15 Claims, 5 Drawing Sheets

LOW-COST SOLAR COLLECTOR

CROSS-REFERENCE TO RELATED APPLICATIONS

This application claims the benefit of provisional patent application Ser. No. 60/857,014 filed 2006 Nov. 6 by the present inventor. A related patent application, application Ser. No. 11/713,899, by the present inventor teaches how to construct solar panels using collectors disclosed in this application.

FEDERALLY SPONSORED RESEARCH

Not Applicable

SEQUENCE LISTING OF PROGRAM

Not Applicable

BACKGROUND OF THE INVENTION

1. Field of Invention

This invention relates to collection and concentration of sunlight for the purpose of reducing the cost of electric power generated from photovoltaic cells.

2. Prior Art

Prior art for concentration of sunlight in photovoltaic systems has employed various techniques using lenses and/or mirrors. In most cases these techniques require two-axis tracking in order to focus the concentrated light on the photovoltaic cells. This increases expense for the tracking mechanism and makes the mounting of panels impractical for many applications such as residential applications that have important aesthetic considerations. Susceptibility to damage and higher maintenance costs are additional disadvantages of two-axis tracking systems. On the other hand solar concentrators that do not require two-axis tracking of the sun suffer from inefficiencies that reduce cost effectiveness. Limitations include reduced concentration factors that affect the photovoltaic cell area savings and suboptimal focusing of light onto surfaces of the photovoltaic cells. Solar concentrators of prior art are also more complex and require good optical tolerances for efficient operation. This increases the cost per unit area of the concentrator. Exceptions are very simple collectors which are relatively less expensive per unit area, but are limited to very low concentration factors and poor focusing of light onto the surfaces of the photovoltaic cells. There are examples of concentrators of this type that do not require any tracking of the sun, but concentration factors are limited to the range of two to three suns and, as a result, savings of photovoltaic cell area are small.

3. Objects and Advantages

Advantages to be sought for solar collectors are high light concentration factors combined with excellent focusing of the concentrated light onto surfaces of the photovoltaic cells. Furthermore, this must be accomplished at low cost of manufacture for the collector. A high concentration factor makes it possible to leverage more electrical energy production from a smaller area of relatively expensive photovoltaic cells. Accurate focusing of light on surfaces of the photovoltaic cells maintains high electrical conversion efficiency over the course of a day taking into account seasonal variations. This invention achieves these advantages by utilizing a cylindrical Cassegrain optical system with planar symmetry. This makes it possible to concentrate the sunlight on a line of photovoltaic cells by rotating the collector to keep the sun in the plane of symmetry. Tracking of the sun can be accomplished simply by rotating the collector through the appropriate angle around its long axis. This enables excellent focusing of sunlight onto surfaces of the photovoltaic cells using a very simple rotation mechanism. Concentration factors can exceed 20× and can be achieved with modest optical quality requirements. This makes it possible to achieve low cost of manufacture for the optical collectors and for the rotation mechanism.

SUMMARY

A solar collector utilizing cylindrical Cassegrain optics with planar symmetry achieves a high light concentration factor that can exceed a factor of 20× in combination with excellent tracking of the sun and focusing of sunlight onto the surfaces of a line of photovoltaic cells arranged along the length of the collector. Maintaining the focus of the concentrated sunlight onto this line of photovoltaic cells is achieved simply by rotating the solar collector around its long axis to keep the sun continuously in the plane of symmetry of the collector. This makes it possible to utilize a simple, inexpensive, high-reliability tracking mechanism. A plurality of these collectors can be arrayed in parallel and driven by a common drive mechanism in a solar panel that complies with conventional form, fit, and function of commercially available solar panels that do not utilize light concentration. This solar collector can be constructed out of a stable transparent material such as glass and can be manufactured at exceptionally low cost. This results from the modest optical quality requirements of the collector and the ability to form the reflective surfaces with adequate accuracy using inexpensive molding techniques. Concentration factors can be adjusted to achieve an optimum tradeoff between area savings of the photovoltaic cells and the optical quality requirements. Generally higher concentration factors require better optical quality. The concentration factor can be adjusted by changing the ratio of the effective focal lengths of the concave and convex reflecting surfaces. Cross-sections of these reflecting surfaces also can be adjusted to optimize the concentration factor and the light uniformity on the photovoltaic cells taking into account refractions at collector surfaces and the finite angular extent of the solar disk. This makes it possible to achieve the lowest possible cost for conversion of sunlight into electrical power.

DRAWINGS

Figures

Figure 2A:
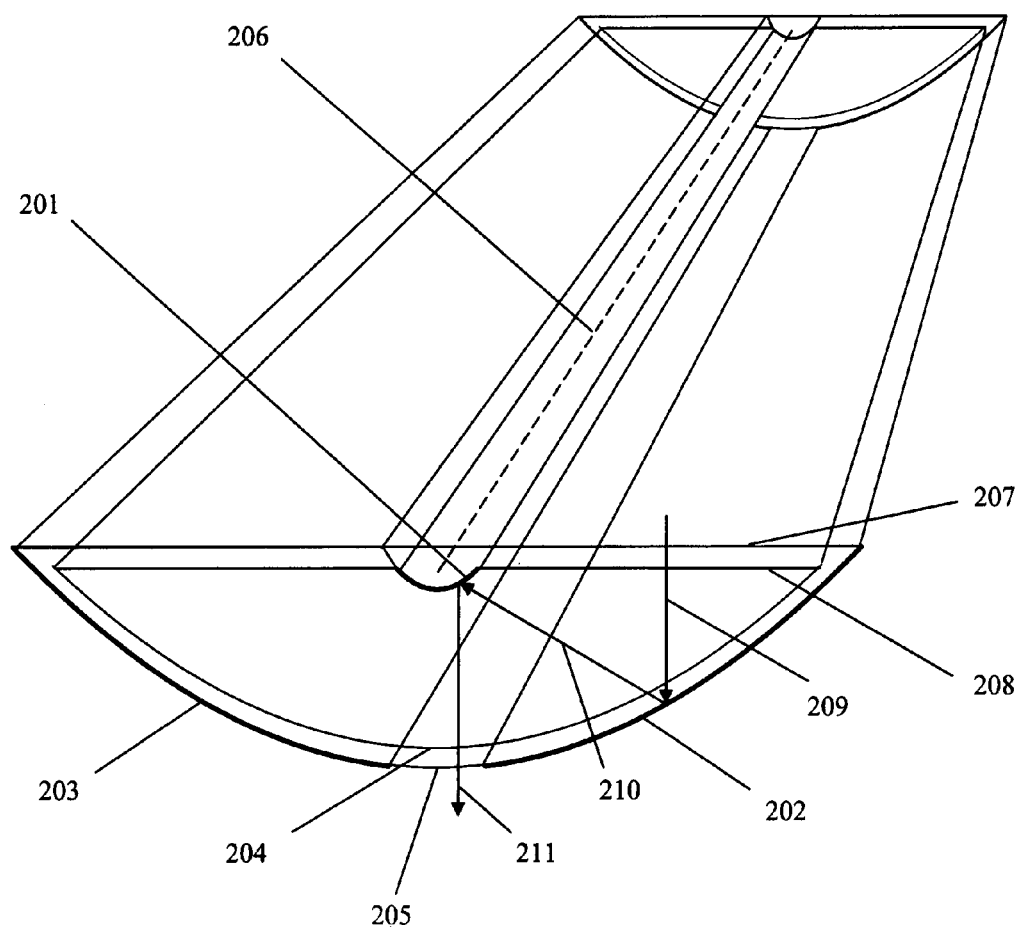
FIG. 2A shows an alternative solar collector constructed of transparent material with reflective coatings applied selectively on its outer lower surface to form a concave mirror surface and on an upper inner convex surface to form a convex mirror surface that can focus concentrated sunlight through a gap in the concave reflecting surface onto a line of photovoltaic cells.
Figure 2B:
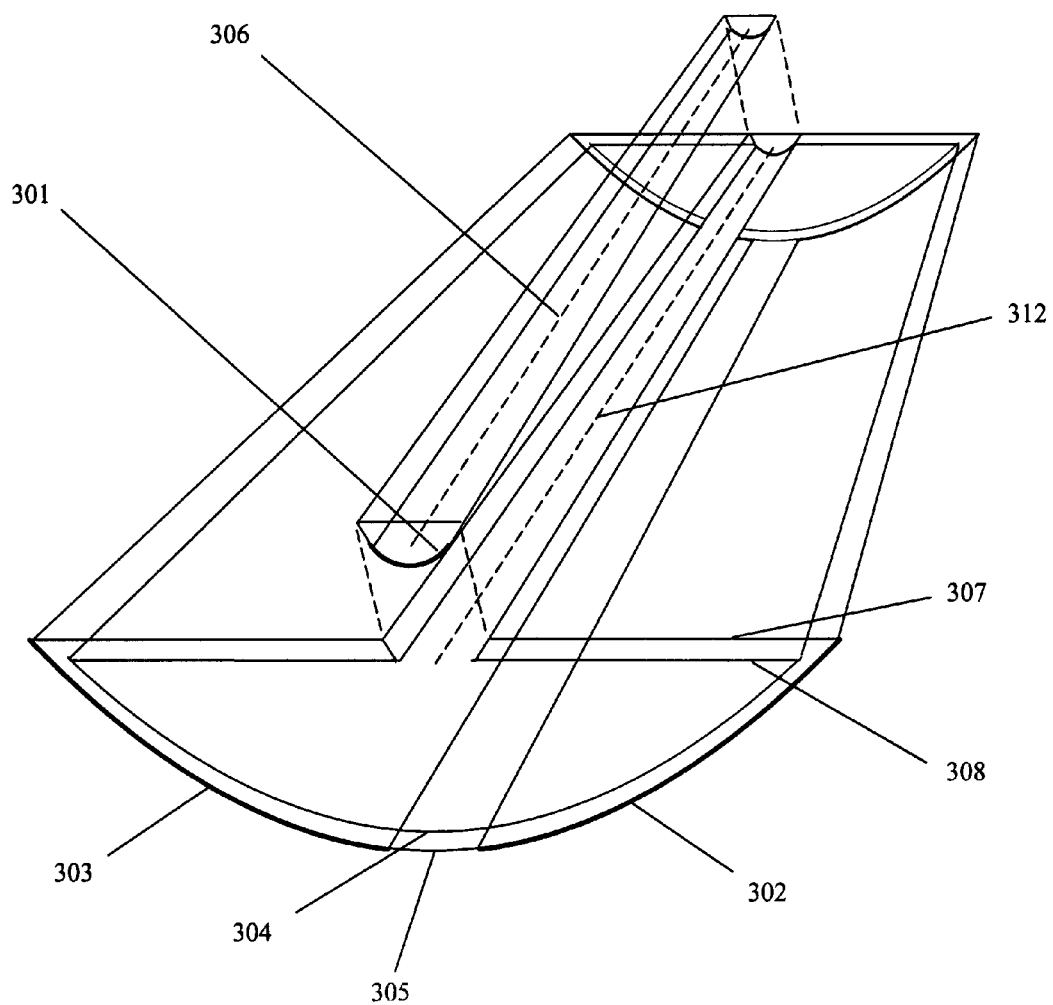

FIG. 2B shows how the upper inner convex surface can be constructed from a separate transparent member with a reflective coating applied to its outer convex surface which is merged with a second transparent member containing the concave reflecting surface to form the cylindrical Cassegrain optical system that can focus concentrated sunlight through a gap in the concave reflecting surface onto a line of photovoltaic cells.

Figure 3:
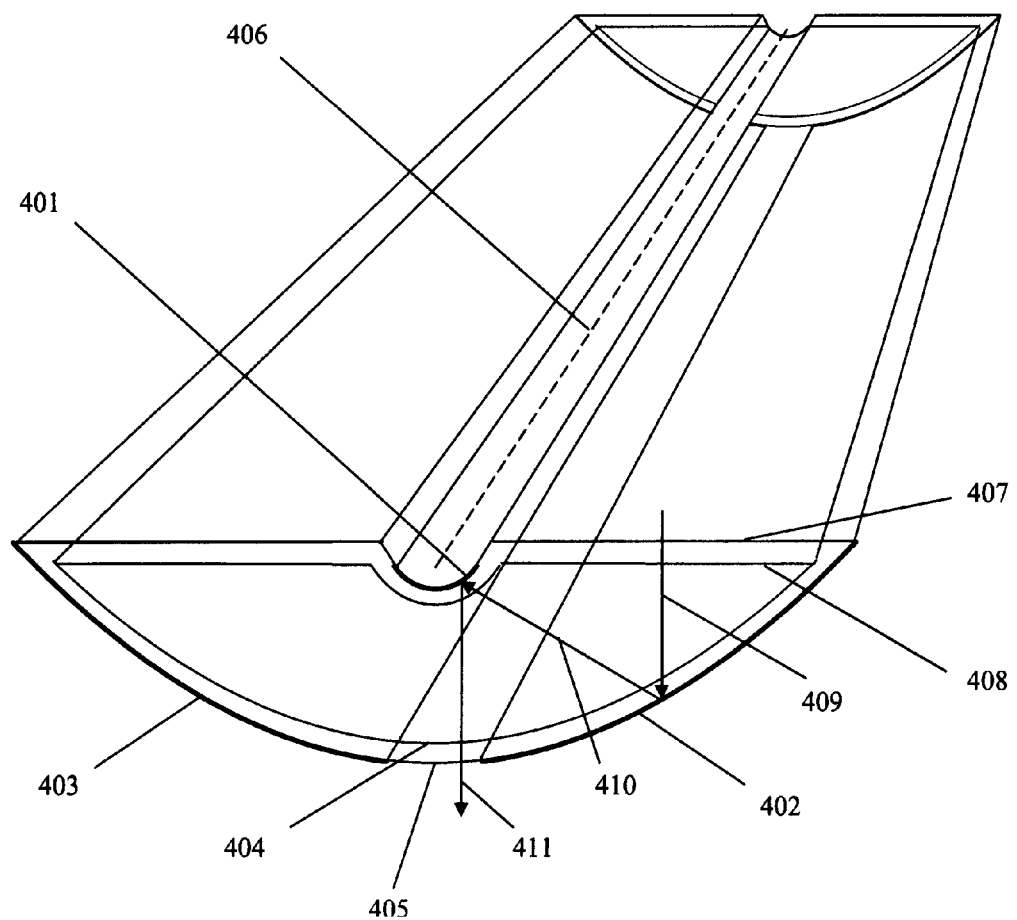

FIG. 3 shows another alternative solar collector constructed of transparent material with reflective coatings applied selectively on its outer surfaces to form a cylindrical Cassegrain optical system with planar symmetry that can focus concentrated sunlight through a gap in the concave reflecting surface onto a line of photovoltaic cells.

Figure 4:
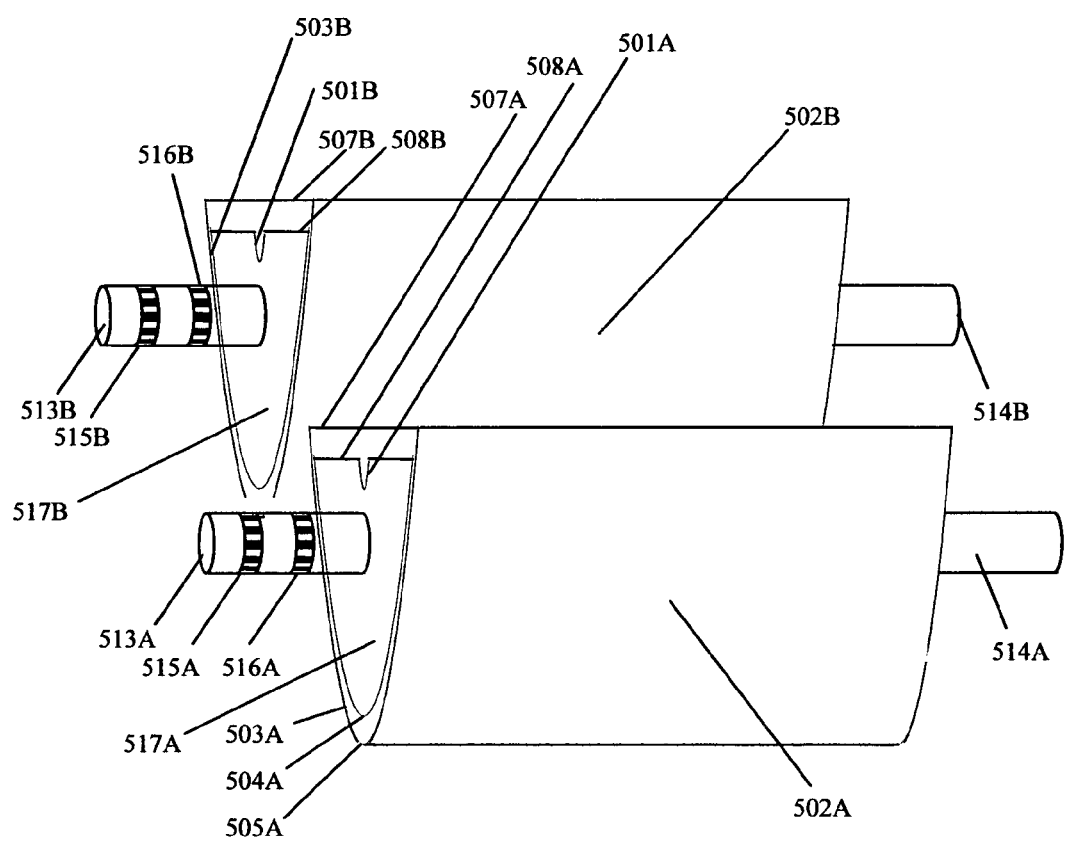

FIG. 4 shows a side view of two solar collectors illustrating how axle segments with gears or sprockets can be appended to the cylindrical Cassegrain optical system to facilitate rotation of a plurality of collectors about axes parallel to the long axes of the collectors employing a single drive mechanism.

DETAILED DESCRIPTION

Figure 1:
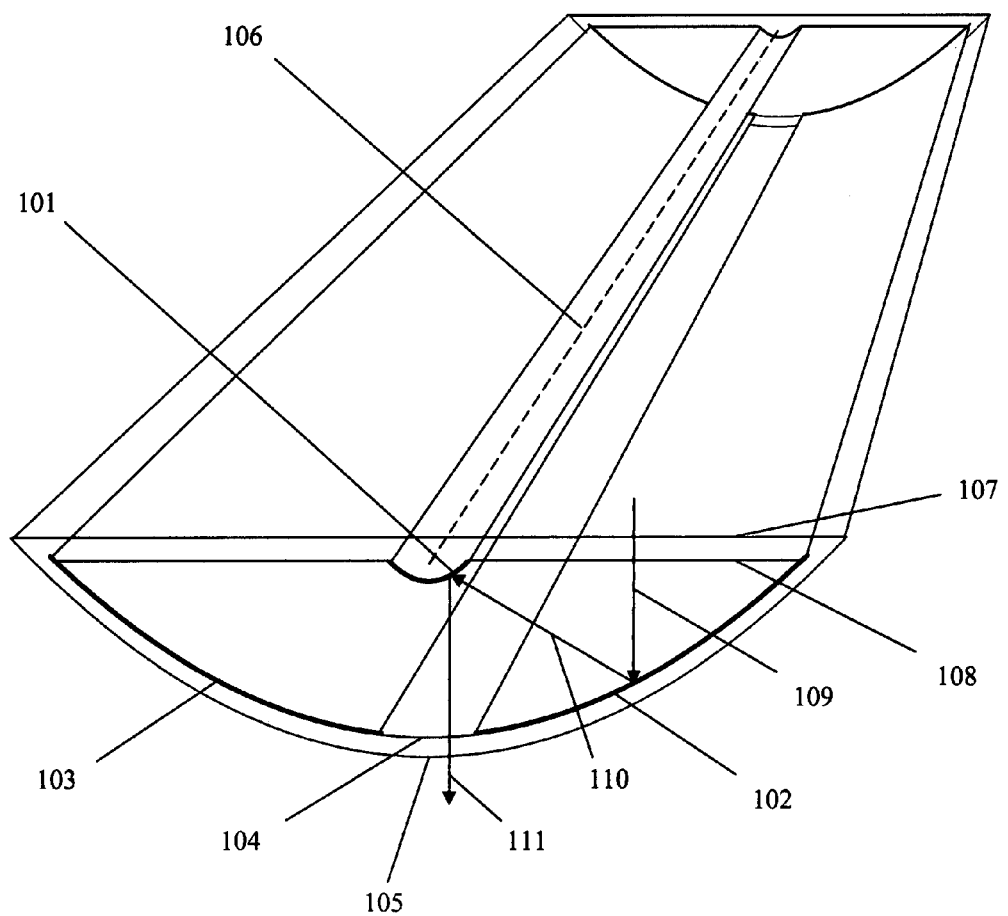
FIG. 1 shows a solar collector constructed of transparent material with reflective coatings applied selectively on its inner surfaces to form a cylindrical Cassegrain optical system with planar symmetry that can focus concentrated sunlight through a gap in the concave reflecting surface onto a line of photovoltaic cells.

Generic Embodiment—FIG. 1

This solar collector incorporates multiple reflective surfaces in a transparent enclosed structure. The structure can be monolithic or it can be formed of two or more pieces that are joined together and permanently sealed in position. The positions and contours of the reflective surfaces can be precisely controlled by means of accurately controlled mold surfaces used to form the structure. The collector can be made of any transparent material that has good long-term dimensional stability.

Glass is a good choice because it is transparent, dimensionally stable, light weight, and chemically inert. Reflective surfaces easily can be applied to glass with excellent long-term durability. Glass is also very inexpensive and can be easily molded into any desired shape. In effect the solar collector is a specially constructed bottle with accurately positioned and configured reflective surfaces. Glass bottles and glass mirror surfaces are extremely durable and can be made at exceptionally low cost.

This solar collector is comprised of two reflecting surfaces. The first surface is an elongated upward-facing concave mirror with a cross section that is substantially parabolic in shape. The second surface is an elongated downward-facing convex mirror with a cross-section that is substantially parabolic in shape. The line of focus of the concave mirror is substantially coincident with the line of focus of the convex mirror. The focal length of the convex mirror is smaller than the focal length of the concave mirror. The concentration ratio for the solar flux is approximately equal to the ratio of the focal length of the concave mirror to the focal length of the convex mirror. A clear gap in the concave reflecting surface that straddles the plane of bilateral symmetry of the reflective surfaces allows the concentrated sunlight to pass out of the collector where it can impinge on photovoltaic cells. The width of this gap is substantially equal to the width of the convex reflecting surface. The focal ratio of the concave and convex mirrors is made as large as possible consistent with good efficiency and adequate heat dissipation since a higher concentration ratio reduces the amount of photovoltaic cell area needed to generate a given amount of electrical power. Efficiency here refers to the total light energy focused on the photovoltaic cells to the total light energy striking the collecting area of the solar collector. The actual dimensions of the convex and concave reflecting surfaces can be scaled to any physical size to optimize the dimensions of the photovoltaic cells and the solar panel size and depth.

FIG. 1 shows a low-cost solar collector constructed out of a transparent dimensionally stable material with reflective coatings added for the purpose of collecting and concentrating light from the sun. The top of this collector is substantially flat and consists of an outer surface 107 and an inner surface 108. The bottom of this collector has a cross section that is substantially that of an upward facing parabola consisting of an inner surface 104 and an outer surface 105. The inner surface of the bottom of the collector is attached to the inner surface of the top of the collector and the outer surface of the bottom of the collector is attached to the outer surface of the top of the collector to form a composite whole with good structural integrity. These structural elements could be manufactured as one monolithic unit of transparent material.

The inner surface of the top of the collector has a bulge that is positioned along the center line of the collector and runs the full length of the collector. The cross section of the inner surface of this bulge is a parabola with a focal line 106 that is substantially coincident with the focal line 106 of the parabolic surface that forms the bottom of the collector. A reflective coating is applied to the inner surface of this bulge 101 which forms a convex mirror surface when viewed from the interior of the collector. A reflective coating is also applied to the inner surface of the bottom of the collector except for the region directly below the convex mirror at the top. This gap in the reflective coating allows the concentrated light reflected from the convex surface above to pass through the gap and out of the collector to the photovoltaic cells. Consequently the reflective surface on the inner surface of the bottom of the collector consists of two halves with one reflector on the right 102 and a second reflector on the left 103.

The solar collector is sealed at both ends and the interior is filled with a dry inert gas in order to minimize degradation of the reflective surfaces and in order to eliminate the possibility of condensation on the inner surfaces. The end seals can be made of the same transparent material as the body of the collector. Efficiency may be improved by applying a reflective coating to one or both end seals. Efficiency may also be improved by applying anti-reflective coatings to the transparent surfaces of the collector. A coating could also be applied to the top of the collector that blocks infra-red wavelengths that are longer than the photovoltaic cells can convert to electrical power. This can help to reduce the amount of heat that must be dissipated from the photovoltaic cells. Since low cost is the first priority, the decision of whether or not to employ coating technologies depends on the cost-benefit analysis.

Operation of the Generic Embodiment—FIGS. 1 and 4

Axle segments are attached to both ends of the collector as shown in FIG. 4 such that the central axis of the two axle segments are on a common line that passes substantially through the center of mass of the collector. This makes it possible to rotate the collector about this axis with minimum torque. A mechanical means such as a gear or a sprocket for imparting rotation to the collector is attached to the axle segment. One or more additional mechanical means are attached to one or both axle segments for transferring rotation to multiple collectors in parallel. This makes it possible to adjust the rotation angle of a plurality of solar collectors in parallel using one drive source. In this manner it is possible to rotate a plurality of collectors in synchronism so the sun is always kept in the plane of bilateral symmetry of each collector. This keeps the concentrated direct rays from the sun focused on the transparent gap in the concave mirror so they can pass out of the collector and impinge on the photovoltaic cells. The photovoltaic cells are positioned in alignment with the transparent gap to intercept the maximum amount of light.

Since the photovoltaic cells are located outside the collector they easily can be attached to a heat sink to dissipate the heat build up efficiently.

The path of a light ray reflected from the reflector on the right is illustrated in FIG. 1. Ray 109 passes through the transparent top of the collector and is reflected by the reflective coating 102. The reflected ray 110 travels to the convex reflective surface 101 where it is reflected vertically downward as ray 111. Ray 111 passes through the transparent bottom of the collector between the reflective surfaces 102 and 103. The light flux at the bottom of the collector is concentrated by a factor approximately equal to the ratio of the focal length of the concave reflective surfaces to the focal length of the convex reflective surface. This ratio is maximized to achieve the largest possible area savings for the photovoltaic cells. Photovoltaic cells are arranged below the collector along the gap in the reflective surfaces in order to take advantage of the concentrated light flux.

FIG. 4 shows the side view of two representative solar collectors positioned side by side as they would be mounted in a solar panel. The interior of the collectors in FIGS. 1, 2A, 2B, and 3 is in each case sealed by end caps 517A, 517B and the interior volume is filled with a dry inert gas to avoid condensation and minimize degradation over time. An axle segment 513A, 513B is attached to the left end cap and a second axle segment 514A, 514B is attached to the right end cap. The central axis of the axle segments on each end are on a common line that passes substantially through the center of mass of the collector. This makes it possible to rotate the collector about the central axis of rotation with minimum torque. The axle segments could be formed of the same transparent material as the body of the collector. These axle segments allow for easy mounting and rotation of the collector about the axis of the axle segments.

Mechanical means 515A, 515B for driving this rotation and controlling the angle of rotation are attached to the axle segments 513A, 513B as shown in FIG. 4. This mechanical means could be a gear or sprocket for example. The combination of the axle segments 513A, 513B and 514A, 514B and the mechanical rotation means 515A, 515B enable rotation of each collector about the axis of its axle segments. This makes it possible to rotate each collector so the sun can be kept continuously in its plane of bilateral symmetry. As long as the sun is kept in this plane of symmetry, direct light rays that pass through the transparent top outer surfaces 507A, 507B and top inner surfaces 508A, 508B of each collector will be reflected by the concave mirror surfaces 502A, 502B or 503A, 503B towards the focal lines. These rays will be reflected from the convex mirror surfaces 501A, 501B and directed through the transparent material in the gaps between the concave reflective coatings. Here they will pass through the inner surfaces of the transparent material 504A, and the outer surface of the transparent material 505A and pass out of the collectors. Photovoltaic cells are arrayed along the gaps in the reflective coatings to intercept the concentrated light flux that passes through the gaps in the reflective coatings that form the concave mirror surfaces.

A second mechanical means 516A, 516B is also attached to the axle segment 513A, 513B for transferring the rotation of one collector to another parallel collector as shown in FIG. 4. This second mechanical means may be a gear or a sprocket for the purpose of transferring rotational motion from one collector to another. This enables multiple identical collectors to be arrayed in parallel and rotated in synchronism. This also makes it possible for one drive to rotate all of the collectors in a panel together so the sun is kept in the planes of symmetry for all of the collectors in the array that comprise the solar panel.

Advantages of the Generic Embodiment—FIG. 1

The generic embodiment of this solar collector has the advantage of a high light concentration factor which enables a significant cost savings for the photovoltaic cells used in a solar panel. This collector also enables simple one-axis tracking of the sun in order to keep the concentrated sunlight focused on the photovoltaic cells. The tracking system can be implemented with a single drive that rotates all copies of the solar collector that comprise a solar panel in synchronism to keep the sun in the plane of symmetry of each of the collectors in the solar panel. The solar collector can be manufactured at exceptionally low cost using glass or other transparent material that can be molded to optical tolerances that permit high concentration factors. These solar collectors can be arrayed in solar panels that have the same form factor as solar panels that do not employ concentration of sunlight. This enables widest possible usage in residential, commercial, and industrial sites. The panels achieve high levels of robustness and low maintenance costs comparable to conventional solar panels that do not utilize concentration.

Solar Collector with the Concave Reflecting Coatings on the Exterior Surface—FIG. 2A FIGS. 2A and 2B show a variation on the collector described in FIG. 1. A major difference between the collector of FIGS. 2A and 2B and the collector of FIG. 1 is how the reflective coating is applied to the bottom of the collector. In the case of FIG. 2A the reflective coatings 203 and 204 that form the concave mirror are applied to the outer surface of the bottom of the collector whereas in FIG. 1 these coatings were applied to the inner surface.

All other features of the collector of FIG. 2A are identical to FIGS. 1. 204 and 205 are the inner and outer surfaces of the bottom of the collector. 206 is the common line of focus of the convex reflecting surface 201 and the concave reflecting surfaces 202 and 203. 207 and 208 are the inner and outer surfaces of the top of the collector. The gap between the two halves of the concave reflecting surfaces 202 and 203 is located directly below the convex reflecting surface 201 and has a width substantially equal to the width of the convex reflecting surface. The path of a direct light ray from the sun is illustrated by the rays 209, 210, and 211.

The convex reflecting surface 201 of FIG. 2A could be formed in the same manner as in FIG. 1. Alternatively, as shown in FIG. 2B, the convex reflecting surface 301 can be formed on a separate structure that can be manufactured as a separate member and then joined to the bottom of the collector.

The convex reflecting surface on the separate member would be joined to the bottom of the collector such that the focal line of the convex surface 306 is substantially coincident with the focal line 312 of the concave surfaces 302 and 303 on the bottom of the collector.

All other features of the collector of FIG. 2B are identical to FIG. 2A. 304 and 305 are the inner and outer surfaces of the bottom of the collector. 307 and 308 are the inner and outer surfaces of the top of the collector. The gap between the two halves of the concave reflecting surfaces 302 and 303 is located directly below the convex reflecting surface 301 and has a width substantially equal to the width of the convex reflecting surface.

Operation of the Solar Collector with the Concave Reflecting Coatings on the Exterior Surface—FIGS. 2A and 2B The operation of the solar collector with exterior reflecting surfaces is identical to the generic collector. This collector would be closed at either end by end caps that provide a means for rotation as shown in FIG. 4.

Advantages of the Solar Collector with the Concave Reflective Coatings on the Exterior Surface—FIG. 3

Applying the coatings to the outer surface has the advantage that it is easier to apply the coatings to the outer surface during manufacture. The reflective coating is in direct contact with the transparent material. This can serve to protect the reflective coating from corrosion and degradation as in the case of glass mirrors for example. Also the exact positioning of the reflective surface can be set by forming the outer surface of the collector against a mold with the proper position and contour. This simplifies manufacturing and reduces cost. In the case of FIG. 2A the cross section of the outer surface that forms the concave reflecting surface is modified to maintain a single line of focus taking into account the refractions that occur at the interfaces to the transparent materials.

The convex reflecting surface can also be formed using a mold to define the surface contour on a separate member and then bonding this separate member to the collector body that contains the concave reflecting surface as shown in FIG. 2B. This makes it possible to form all reflecting surfaces using a mold to form external surfaces, which can further improve optical quality and reduce manufacturing cost.

Monolithic Solar Collector with Exterior Reflecting Surfaces—FIG. 3

FIG. 3 shows another variation on the collectors described in FIG. 1 and in FIGS. 2A and 2B. In FIG. 3 the reflective surfaces of both the concave reflective surfaces 402 and 403 and the convex reflective surface 401 are all formed on the outside surfaces of the collector. This has the advantage that the exact contour and positioning of each of the reflective surfaces can be set by forming the outer surface of the collector against a mold with the proper position and contour. The cross section of the outer surface that defines the convex mirror and the cross section of the outer surface that defines the concave mirrors are modified to maintain a single line of focus for both convex and concave mirrors taking into account the refractions that occur at the interfaces to the transparent material that comprises the structure of the collector. It should be possible to configure contours at the interfaces to the inner surfaces of the transparent material over the convex mirror and over the concave mirror such that much of the light reflected at this interface is also focused on the transparent gap at the bottom of the collector.

All other features of the collector of FIG. 3 are identical to FIG. 2A. 404 and 405 are the inner and outer surfaces of the bottom of the collector. 406 is the common line of focus of the convex reflecting surface 401 and the concave reflecting surfaces 402 and 403. 407 and 408 are the inner and outer surfaces of the top of the collector. The gap between the two halves of the concave reflecting surfaces 402 and 403 is located directly below the convex reflecting surface 401 and has a width substantially equal to the width of the convex reflecting surface. The path of a direct light ray from the sun is illustrated by the rays 409, 410, and 411.

Operation of the Monolithic Solar Collector with Exterior Reflecting Surfaces—FIG. 3

The operation of the monolithic solar collector with exterior reflecting surfaces is identical to the generic collector. This collector would be closed at either end by end caps that provide a means for rotation as shown in FIG. 4.

Advantages of the Monolithic Solar Collector with Exterior Reflecting Surfaces—FIG. 3

Advantages of the monolithic solar collector are the same as for the solar collector with exterior concave reflecting surfaces. In this case the convex reflecting surface is also formed in the exterior surface of the top of the collector. Applying the coatings to the outer surface has the advantage that it is easier to apply the coatings to the outer surface during manufacture. The reflective coating is in direct contact with the transparent material. This can serve to protect the reflective coating from corrosion and degradation as in the case of glass mirrors for example. Also the exact positioning of the reflective surface can be set by forming the outer surface of the collector against a mold with the proper position and contour. As in the case of FIG. 2A the cross section of the outer surface is modified to maintain a single line of focus taking into account the refractions that occur at the interfaces to the transparent materials. This simplifies manufacturing and reduces cost.

An additional potential advantage of the collector of FIG. 3 is that it can also be built of one solid continuous structure of transparent material. This has the advantages of eliminating reflections and refractions from the interior surfaces of the transparent material. This reduces the loss of light flux due to any reflections that are not focused on the transparent gap in the concave mirror. It also simplifies the calculation of the positions and contours of the reflecting surfaces, but this should not be a significant consideration. The disadvantage is the increased amount of transparent material required and the increased weight of the solar collector.

CONCLUSION, RAMIFICATIONS, AND SCOPE

This solar collector achieves a high light concentration factor for the case of an optical system with planar symmetry, which focuses light along a plane. Planar symmetry allows tracking of the sun using one-axis tracking to keep the sun continuously in the plane of symmetry. This is accomplished by rotating the collector around its long axis. This is to be compared with solar collectors that utilize axial symmetry and focus light to a point. Axial symmetry enables much higher light concentration factors, but at the expense of requiring two-axis tracking of the sun.

Concentrating solar collectors achieve their cost advantage by reducing the area of photovoltaic cells required to convert light energy into electrical energy. A higher concentration factor improves this cost savings, but the cost of the collector and the cost of the tracking mechanism must be taken into account. This cylindrical Cassegrain solar collector with planar symmetry achieves an optimal balance of high concentration, simple tracking, and exceptionally low-cost optics. Moreover, a plurality of these collectors can be arranged in parallel in a solar panel that has the same form factor as conventional solar panels that do not concentrate sunlight. This simplifies installation and broadens the range of applications to all residential, commercial, and industrial sites. This solar collector also provides a mechanical means for rotating all collectors in a panel together in synchronism using a single common drive.

Exceptionally low cost is achieved by utilizing an inexpensive transparent material such as glass to form the structure that supports the concave and convex reflecting surfaces. These surfaces can easily be molded with optimized contours and spacings. In some embodiments of this solar collector the reflective surfaces can be formed directly on mold surfaces that can be made with very precise tolerances. This means that the structure of the solar collector can be manufactured at a cost comparable to that of manufacturing glass bottles.

This solar collector also has the advantage of flexibility. Actual dimensions of the solar collector can be scaled to any value that is optimum for lowest cost and for incorporation into a solar panel of any desired dimensions. The concentration factor can be adjusted by altering the cross-sections of the concave and convex reflecting surfaces. The embodiments discussed here have used the example of parabolic cross-sections for the concave and convex reflecting surfaces. This would be optimal if the sun were a point source of light located an infinite distance away. In this case parallel light rays from this source would be parallel to each other again after reflection from the convex reflecting surface and would illuminate the photovoltaic cells uniformly but with greater intensity. Of course the sun is not a point source of light. Furthermore, some embodiments of this solar collector would interpose interfaces along the light path with dissimilar indexes of refraction resulting in refraction of the light along its path through the collector. For these reasons the optimal cross-sections for the concave and convex reflecting surfaces will deviate from parabolas. The scope of this invention is not constrained to particular cross-sections for the reflecting surfaces. The cross-sections need not be parabolas or hyperboloids as in the case of the classical Cassegrain telescope. The optimized cross-sections will deviate slightly from these geometries in order to maximize the concentration factor and make the illumination of the photocells as uniform as possible with minimal loss of collected light energy.

Similarly the line of focus of the concave reflecting surface and the convex reflecting surface may not coincide exactly. It may be possible to improve the concentration factor and reduce the light loss by adjusting these positions slightly. The line of photovoltaic cells also need not be outside the collector. There may be an advantage to moving the photovoltaic cells closer to the convex reflecting surface, for example. The photovoltaic cells could be moved inside the collector. Or the lower concave surface of the collector could be deformed toward the convex reflecting surface over the gap between the two halves of the concave reflecting surface to keep the photovoltaic cells outside the collector.

The vertical heights of the concave reflecting surface and the convex reflecting surface could extend above or below their focal lines. The scope of this invention is not constrained to the case illustrated in which the heights of the concave reflecting surface and the convex reflecting surface are equal to the heights of their focal lines. This selection has the advantage that the top of the collector is a planar surface that is perpendicular to the incident sunlight. It also has the advantage that the height-to-width aspect ratio of the collector is minimized. The height of the concave reflecting surface and the height of the convex reflecting surface could extend above or below the focal lines of these surfaces but this would be suboptimal.

Examples have been provided for solar collectors having reflective coatings on interior surfaces and on exterior surfaces. The scope of this invention is not constrained to the specific cases cited. Any combination of reflective coatings on interior or exterior surfaces could be used. The choice depends on manufacturing cost, maximum usable concentration ratio, and durability. The collector could be manufactured as one monolithic molded structure or it could be manufactured in one or more pieces that are subsequently permanently bonded together. In general use of a hollow solar collector structure has the advantage of lighter weight and less material. Use of reflective coatings on interior surfaces has the advantage of better protection of these surfaces from degradation. Use of reflective surfaces on exterior surfaces has the advantage of ease of manufacture to excellent optical tolerances using accurately configured and positioned mold surfaces. Use of exterior reflective surfaces also enables implementation of a molded solid collector that would possess maximum strength.

The invention claimed is:

1. A solar collector constructed out of transparent material comprising:
   a. a top plate having a rectangular shape when projected on a horizontal plane and having a top outer surface and a bottom inner surface, and
   b. a bottom trough-shaped structural element that is attached to said top plate along two of said top plate's opposite edges and having a top inner surface and a bottom outer surface, and
   c. an integrated bulge in said top plate that runs along the center line of said top plate parallel to said two opposite edges of said top plate that are connected to said bottom trough-shaped structural element and said integrated bulge having a parabolic cross-section on said top outer surface or on said bottom inner surface of said top plate in a plane perpendicular to said top plate's two opposite edges with the focal line of said parabolic cross-section parallel to said center line of said top plate and equidistant to the sides of said bottom trough-shaped structural element, and
   d. said bottom trough-shaped structural element has a parabolic cross-section in a plane perpendicular to said top plate's two opposite edges, and
   e. wherein said solar collector is constructed of one continuous monolithic structure of transparent material having an outward facing surface defined by said top outer surface of said top plate and by said bottom outer surface of said trough-shaped structural element and an inward-facing surface defined by said bottom inner surface of said top plate including said bulge in said top plate and by said top inner surface of said trough-shaped structural element, and
   f. wherein the cross-section of said monolithic structure in a plane perpendicular to said focal line is invariant for a cross-section taken anywhere along the full length of said collector, and
   g. a first reflective coating applied to said top inner surface or to said bottom outer surface of said bottom trough-shaped structural element such that said first reflective coating comprises a cylindrical upward-facing concave mirror having a concave-mirror focal line that is coincident with said focal line of said integrated bulge in said top plate, and
   h. a second reflective coating applied to said top outer surface or to said bottom inner surface of said bulge in said top plate such that said second reflective coating comprises a cylindrical downward-facing parabolic mirror with a focal line that runs along or parallel to said center line of said top plate and equi-distant to the sides of said bottom trough-shaped structural element, and i. a gap in said first reflective coating applied to said inner surface or applied to said outer surface of said bottom trough-shaped structural element that is centered along the center line that runs the length of said bottom trough-shaped structural element having a width equal to the width of said second reflective coating applied to said top outer surface or applied to said bottom inner surface of said bulge in said top plate, and j. a photovoltaic cell or cells positioned immediately outside said gap in said first reflective coating such that all of the rays that comprise the concentrated beam of parallel rays that pass through said gap strike said photovoltaic cell or cells, and whereby said solar collector has a plane of bilateral symmetry such that light rays directed from above said top plate towards said collector and traveling parallel to said plane of symmetry will be reflected from said first reflective coating comprising said cylindrical concave mirror towards said concave-mirror focal line and will be reflected a second time from said second reflective coating comprising said cylindrical parabolic mirror into a beam of concentrated parallel rays that passes through said gap in said first reflective coating that comprises said concave mirror and where photovoltaic cells are positioned immediately outside said transparent gap to intercept the concentrated light.

2. The solar collector of claim 1 further including:

a. a first end cap shaped to match the contour of said integrated bulge and said top plate along its top edge and along its bottom edge shaped to match the contour of said bottom trough-shaped structural element which completely encloses the first end of said solar collector, and b. a second end cap shaped to match the contour of said integrated bulge and said top plate along its top edge and along its bottom edge shaped to match the contour of said bottom trough-shaped structural element which completely encloses the second end of said solar collector, and c. said complete solar collector structure is made air tight and filled with a dry inert gas, and whereby said solar collector is guaranteed to be free of condensation on all interior surfaces and degradation of internal surfaces over time is minimized.

3. The solar collector of claim 2 further including:

a. a first axle segment having a central axis parallel to said coincident focal lines that is contained in said plane of bilateral symmetry and that is attached to said first end cap, and b. a second axle segment having a central axis on a common line through said central axis of said first axle segment and that is attached to said second end cap, and whereby said solar collector can be rotated about said common line through said central axes of said first and second axle segments and a light source such as the sun can be kept continually in said plane of bilateral symmetry.

4. The solar collector of claim 3 further including:

a. a mechanical means for imparting rotation to said solar collector such as gears or sprockets attached to said axle segments, and whereby said solar collector is driven in parallel with other copies of said solar collector arranged with the sides of their respective trough-shaped structural elements located side by side and with all focal lines parallel to one another by a common drive mechanism that rotates the plurality of solar collectors around their long axes to keep the sun continuously in the plane of symmetry of each of said plurality of collectors.

5. The solar collector of claim 4 wherein a. the material used for said transparent structures in said solar collector is glass and b. said end caps are transparent and constructed of glass and shaped to match the contour of said integrated bulge having a parabolic cross-section and said top plate along its top edge and along its bottom edge shaped to match the contour of said bottom trough-shaped structural element having a parabolic cross-section and a focal line that is coincident with said focal line of said parabolic cross-section of said integrated bulge in said top plate and c. either said first end cap or said second end cap or both end caps can be made reflective by applying a reflective coating to the surface of said first end cap or said second end cap or to both end caps so as to make them reflective in any desired combination including the option of making neither reflective, and d. wherein said solar collector is built of one continuous structure of glass to which is applied said first and second reflective coatings and to which is attached said mechanical means for imparting rotation to said collector and whereby said solar collector can be manufactured at low cost from one continuous piece of glass except for said reflective coatings and for said mechanical means for imparting rotation to said solar collector such as a gear or sprocket attached to said axle segments.

6. A solar collector constructed out of a solid structure of transparent material comprising:

a. a top surface having a rectangular shape when projected on a horizontal plane with a center line along the long dimension of said rectangle, and b. a bottom trough-shaped surface having a parabolic cross-section in a plane perpendicular to said center line of said top surface, and c. a trough or bulge in said top surface that is centered on said center line of said top surface having a parabolic cross-section in a plane perpendicular to said center line with the focal line of said trough or bulge aligned parallel to said center line of said top surface, and equidistant to the sides of said bottom trough-shaped surface, and d. wherein said solar collector is constructed of one continuous monolithic structure of transparent material having an outward facing surface defined by said top surface having a trough or bulge with parabolic cross-section and by said bottom trough-shaped surface having a parabolic cross-section, and e. wherein the cross-section of said solid monolithic structure in a plane perpendicular to said focal line is invariant for a cross-section taken anywhere along the full length of said collector, and f. a first reflective coating applied to said bottom trough-shaped surface such that said first reflective coating comprises a cylindrical upward-facing concave mirror having a concave-mirror focal line that is coincident with said focal line of said integrated parabolic trough or bulge in said top surface, and g. a second reflective coating applied to said trough or bulge in said top surface such that said second reflective coating comprises a cylindrical downward-facing parabolic mirror with a focal line that runs parallel to said center line of said top surface coincident with said focal line of said first reflecting surface, and h. a gap in said first reflective coating applied to said bottom trough-shaped surface that is centered along the center line that runs the length of said bottom trough-shaped structural element and having a width equal to the width of said second reflective coating applied to said trough or bulge in said top surface, and i. a photovoltaic cell or cells positioned immediately outside said gap in said first reflective coating such that all of the rays that comprise the concentrated beam of parallel rays that pass through said gap strike said photovoltaic cell or cells, and whereby said solar collector has a plane of bilateral symmetry such that light rays directed from above said top surface towards said collector and traveling parallel to said plane of symmetry will be reflected from said first reflective coating comprising said cylindrical concave mirror towards said concave-mirror focal line and will be reflected a second time from said second reflective coating comprising said second parabolic cylindrical mirror into a beam of concentrated parallel rays that passes through said gap in said first reflective coating that comprises said concave mirror and where photovoltaic cells are positioned immediately outside of said transparent gap to intercept the concentrated light.

7. The solar collector of claim 6 further including:

a. a first end cap shaped to match the contour of said integrated bulge or trough in said top surface along its top edge and along its bottom edge shaped to match the contour of said bottom trough-shaped structural element which completely encloses the first end of said solar collector, and b. a second end cap shaped to match the contour of said integrate bulge or trough in said top surface along its top edge and along its bottom edge shaped to match the contour of said bottom trough-shaped structural element which completely encloses the second end of said solar collector.

8. The solar collector of claim 7 further including:

a. a first axle segment having a central axis parallel to said coincident focal lines that is contained in said plane of bilateral symmetry and that is attached to said first end cap, and b. a second axle segment having a central axis on a common line through said central axis of said first axle segment and that is attached to said second end cap, and whereby said solar collector can be rotated about said common line through said central axes of said first and second axle segments and a light source such as the sun can be kept continually in said plane of bilateral symmetry.

9. The solar collector of claim 8 further including:

a. a mechanical means for imparting rotation to said solar collector such as gears or sprockets attached to said axle segments, and whereby said solar collector is driven in parallel with other copies of said solar collector arranged with the sides of their respective trough-shaped structural elements located side by side and with all focal lines parallel to one another by a common drive mechanism that rotates the plurality of solar collectors around their long axes to keep the sun continuously in the plane of symmetry of each of said plurality of collectors.

10. The solar collector of claim 9 wherein a. the material used for said transparent structures in said solar collector is glass and b. said end caps are transparent and constructed of glass and c. either said first end cap or said second end cap or both end caps can be made reflective by applying a reflective coating to the surface of said first end cap or said second end cap or to both end caps so as to make them reflective in any desired combination including the option of making neither reflective, and d. wherein said solar collector is built of one continuous structure of glass to which is applied said first and second reflective coatings and to which is attached said mechanical means for imparting rotation to said collector and whereby said solar collector can be manufactured at low cost from one continuous piece of glass except for said reflective coatings and for said mechanical means for imparting rotation to said solar collector.

11. A solar collector constructed out of a transparent material comprising:

a. a top plate having a top outer surface and a bottom inner surface with an opening symmetrically situated along the center line of said top plate, and b. a bottom trough-shaped structural element that is attached to said top plate along two of said top plate's two opposite edges that are parallel to said opening in said top plate having a parabolic cross-section in a plane perpendicular to the lines of attachment and having a top inner surface and a bottom outer surface, and c. wherein the cross-section of said top plate and said trough-shaped structural element in a plane perpendicular to said lines of attachment is invariant for a cross-section taken anywhere along the full length of said collector, and d. a first reflective coating applied to said top inner surface or to said bottom outer surface of said bottom trough-shaped structural element such that said first reflective coating comprises a cylindrical concave mirror having a focal line parallel to said center line of said top plate and located in the opening in said top plate, and e. an elongated structural member incorporating a parabolic cylindrical surface along one side and having a second reflective coating on said parabolic cylindrical surface and sized in length and width so as to fit snugly into said opening in said top plate with a focal line that runs parallel to the center line of said top plate and is made coincident with said focal line of said first reflective coating when fitted into said opening in said top plate, and f. wherein the cross-section of said elongated structural member in a plane perpendicular to said focal line is invariant for a cross-section taken anywhere along the full length of said elongated structural member, and g. a gap in said first reflective coating applied to said inner surface or applied to said outer surface of said bottom trough-shaped structural element that is centered along the center line that runs the length of said bottom trough-shaped structural element having a width equal to the width of said parabolic cylindrical mirror surface, and h. a photovoltaic cell or cells positioned immediately outside said gap in said first reflective coating such that all of the rays that comprise the concentrated beam of parallel rays that pass through said gap strike said photovoltaic cell or cells, and whereby said solar collector has a plane of bilateral symmetry such that light rays directed from above said top plate towards said collector and traveling parallel to this plane of symmetry will be reflected from said first reflective coating comprising said cylindrical concave mirror towards said concave-mirror focal line and will be reflected a second time from said second reflective coating comprising said parabolic cylindrical mirror on said elongated structural member into a beam of concentrated parallel rays that passes through said gap in said first reflective coating that comprises said concave mirror and where photovoltaic cells are positioned immediately outside said transparent gap to intercept the concentrated light.

12. The solar collector of claim 11 further including:
   a. a first end cap shaped to match the contour of said integrated bulge and said top plate along its top edge and along its bottom edge shaped to match the contour of said bottom trough-shaped structural element which completely encloses the first end of said solar collector, and
   b. a second end cap shaped to match the contour of said integrated bulge and said top plate along its top edge and along its bottom edge shaped to match the contour of said bottom trough-shaped structural element which completely encloses the second end of said solar collector, and
   c. said complete solar collector structure is made air tight and filled with a dry inert gas, and
whereby said solar collector is guaranteed to be free of condensation on all interior surfaces and degradation of internal surfaces over time is minimized.

13. The solar collector of claim 12 further including:
   a. a first axle segment having a central axis parallel to said coincident focal lines that is contained in said plane of bilateral symmetry and that is attached to said first end cap, and
   b. a second axle segment having a central axis on a common line through said central axis of said first axle segment and that is attached to said second end cap, and
   whereby said solar collector can be rotated about said common line through said central axes of said first and second axle segments and a light source such as the sun can be kept continually in said plane of bilateral symmetry.

14. The solar collector of claim 13 further including:
   a. a mechanical means for imparting rotation to said solar collector such as a gears or sprockets attached to said axle segments, and
whereby said solar collector is driven in parallel with other copies of said solar collector arranged with the sides of their respective trough-shaped structural elements located side by side and with all focal lines parallel to one another by a common drive mechanism that rotates the plurality of solar collectors around their long axes to keep the sun continuously in the plane of symmetry of each of said plurality of collectors.

15. The solar collector of claim 14 wherein
   a. the material used for said transparent structures in said solar collector is glass and
   b. said end caps are transparent and constructed of glass and shaped to match the contour of said integrated bulge having a parabolic cross-section and said top plate along its top edge and along its bottom edge shaped to match the contour of said bottom trough-shaped structural element having a parabolic cross-section and a focal line that is coincident with said focal line of said parabolic cross-section of said integrated bulge in said top plate and
   c. either said first end cap or said second end cap or both end caps can be made reflective by applying a reflective coating to the surface of said first end cap or said second end cap or to both end caps so as to make them reflective in any desired combination including the option of making neither reflective, and
   d. wherein said solar collector is built of one continuous structure of glass to which is applied said first and second reflective coatings and that is attached to said mechanical means for imparting rotation to said collector and
whereby said solar collector can be manufactured at low cost from one continuous piece of glass except for said reflective coatings and for said mechanical means for imparting rotation to said solar collector.

* * * * *